April 16, 1968 N. W. BURKE 3,378,702
PULSE GENERATOR EMPLOYING UJT RELAXATION OSCILLATOR
WITH PARTICULAR CONTROL CIRCUITRY
Filed Sept. 29, 1965
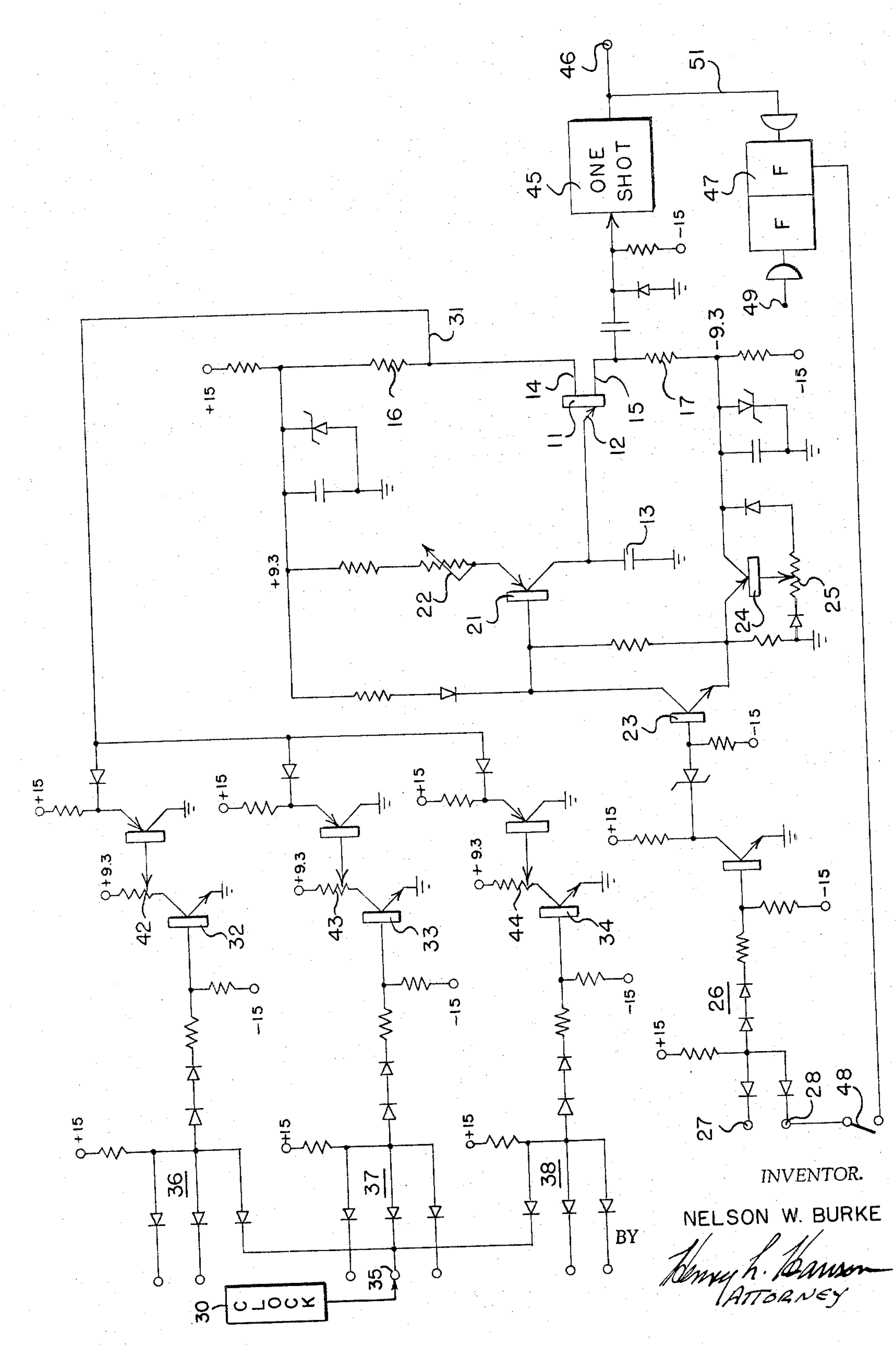
INVENTOR.
NELSON W. BURKE
BY Henry L. Hanson
ATTORNEY United States Patent Office 3,378,702

Patented Apr. 16, 1968

3,378,702

PULSE GENERATOR EMPLOYING UJT RELAXATION OSCILLATOR WITH PARTICULAR CONTROL CIRCUITRY

Nelson W. Burke, Stoneham, Mass., assignor to Honeywell Inc., Minneapolis, Minn., a corporation of Delaware Filed Sept. 29, 1965, Ser. No. 491,104
10 Claims. (Cl. 307—265)

ABSTRACT OF THE DISCLOSURE

A pulse generator using a unijunction transistor relaxation oscillator has a constant charging current transistor for charging the timing capacitor and a gated discharge transistor to rapidly discharge the capacitor to a pre-set voltage level. Pulse control of the peak point voltage for the unijunction transistor improves the precision of timing to correspond to that of the pulse source and a control of the discharge transistor from the circuit's own pulse output permits the device to be used as a precision delay for the start of the pulse output.

This invention relates generally to pulse generation and control circuits and more particularly to circuit arrangements which have a broad range of uses in connection with data processing and data transmission and reception in connection with data processing equipment.

Circuits in accordance with the invention may be used, for example, to generate timing waveforms of extremely wide time range with selective control of either or both the starting point and end point for the timing voltage waveform thereby permitting course or fine adjustment of the timing period. One feature of the invention provides an auxiliary discharge circuit for the timing capacitor which is particularly useful in establishing accurate timing waveforms for long periodic intervals since the starting point for the waveform is established upon discharge accurately and precisely both with respect to time and voltage. Another feature permits reading data bits from a magnetic tape, for example, or from a data bit stream utilized either for transmitting or receiving on a communication line. In this application the circuit is readily adapted to provide a strobe at the midpoint of the data bit and maintain the strobe accurately positioned at midpoint by means of a count adding and subtracting comparison that makes the timing waveform as accurate as the precision clock pulse source used for the pulse addition or subtraction feature. For triggered operation the circuit can also provide a pulse delay with the precision provided by the aforementioned features of the timing circuit. A further mode of operation useful in start-stop telegraphy would permit the generation of the first pulse with a precise pulse delay with the circuit thereafter free-running to strobe the bits of the start-stop character.

It is accordingly the principal object of the present invention to provide a simple and economical circuit which has a widespread field of use in the handling of pulse data signals and capable of providing any one of a plurality of different functions with the same basic circuit package, thereby providing a standard equipment unit that can be introduced as desired in the overall data handling system.

The objects and features of the invention will be more readily apparent from the following detailed description taken in conjunction with the single figure which shows a schematic circuit diagram of the preferred form of the invention.

Referring now to the drawing, the circuit of the invention employs a timing waveform generator utilizing a unijunction transistor 11 having an emitter electrode 12 connected to a timing capacitor 13. The unijunction transistor 11 has base electrodes 14 and 15 connected through impedance elements 16 and 17 to regulated positive and negative supply voltage terminals supplied by Zener voltage reference diodes.

The timing capacitor 13 is charged through a constant current transistor 21 the collector emitter path of which supplies a constant charging current to the capacitor 13 through an adjustable resistance 22.

The base of constant current transistor 21 is connected through the collector emitter path of a control transistor 23 to a voltage reference level to which the emitter of transistor 23 is connected. This voltage may be a predetermined voltage or as shown in the drawing may be an adjustable voltage on the emitter of transistor 24 as determined by the setting of potentiometer 25 controlling the base electrode of transistor 24. With the circuit as shown the adjustment of potentiometer 25 varies the voltage level for the emitter of transistor 23 and thereby permits adjustment of the discharge voltage level to which capacitor 13 discharges and hence the starting point for the timing waveform rise as capacitor 13 starts to charge after being discharged.

The control transistor 23 is connected to an input network 26 which is arranged to make transistor 23 normally conductive and responsive to input signals from the input terminals 27 and 28 of the network 26 to render the control transistor 23 non-conductive. When control transistor 23 is conductive the emitter collector path passes current which comes from charging capacitor 13 through the collector-base junction of constant current transistor 21 thereby providing a discharge path for the charging capacitor 13 to the pre-set voltage level established at the emitter of control transistor 23. This discharge path for the capacitor 13 is in addition to the discharge path across the junction from emitter 12 to base 15 of the unijunction transistor 11 which conducts when the emitter 12 voltage equals the peak point voltage for the unijunction transistor 11.

Depending upon the function the circuit is to perform, the control transistor 23 can be controlled to be non-conductive for each period of oscillation of unijunction transistor 11 or for a plurality of such periods. Where transistor 23 is non-conductive for a plurality of periods, the selected voltage provided by transistor 24 permits adjustment of the time position of the first pulse generated by transistor 11 but does not influence the period of subsequent pulses in the interval when transistor 23 is cut off. However, where transistor 23 is gated off and on for each oscillation period of unijunction transistor 11 the voltage supplied by transistor 24 influences the length of each period.

The peak point voltage at which conduction occurs in unijunction transistor 11 can also be influenced by the applied voltage across base electrodes 14, 15 and in accordance with one feature of the present invention the peak point voltage is controlled dynamically by the application of pulse signals on line 31. For this purpose line 31 is supplied pulses from a series of transistors 32, 33 and 34 all of which have applied as input signals to their respective bases the precision clock pulse associated with the data processing system with which the circuit is used. As shown in the drawing, the clock pulses from clock 30 are applied to terminal 35 and the passage of the clock pulses determined selectively among the group of input pulse circuit transistors 32, 33 and 34 in accordance with the condition of AND gates 36, 37 and 38. The AND gates 36, 37 and 38 may be controlled in accordance with any desired control function and as a particular example may be selectively enabled by a comparison of the data rate and the strobe position generated in response to the oscillation period of unijunction transistor 11. Thus when the period of oscillation for unijunction transistor 11 is equal to a desired integral number of pulses, say *n*, from the clock signal applied to terminal 35, the AND gate 37 will be enabled and this condition will be maintained. If this desired condition does not prevail, a control signal to increase or decrease the period of the unijunction transistor oscillation can be produced by enabling either gate 36 or 38 as hereinafter described.

The clock pulse signals passed by the gates 36, 37 and 38 are passed with different amplitudes from the collector circuits of the transistors 32, 33 and 34 respectively by virtue of adjustment of the potentiometers 42, 43 and 44 in the respective collector circuits. Thus when the different gates 36, 37 and 38 are enabled a different amplitude pulse at the clock rate will be applied to line 31 and this different amplitude pulse is adjusted either to lengthen or shorten the period of oscillation of transistor 11 by increasing or decreasing the peak point voltage for the transistor 11 in the case of gates 36 or 38 being enabled. In the case of gate 37 being enabled the voltage pulse applied to line 31 is that which makes the peak point voltage for transistor 11 correspond to the voltage level reached on charging capacitor 13 with a period that is exactly equal to the desired integral number of clock pulses. With this arrangement the timing accuracy of the charging waveform generated by the circuit associated with transistor 11 is converted from one which has an accuracy of the order of a few percent to one which has the accuracy associated with the precision clock pulse generator. This is achieved since slight variations in the timing waveform, which are inevitable in such low precision circuits, are completely overcome by the occurrence of the pulse voltage waveform on line 31 to produce the peak point voltage level for transistor 11 at the precise time desired.

Ordinarily the potentiometers 42 and 44 will be adjusted to change the integral relation between the clock rate and the period of oscillation of transistor 11 by one pulse either up or down thereby permitting the strobe pulse in a data reading or writing application to be gradually established at the midpoint of the data bit. The circuit of transistor 11 is thereby subject to a precise automatic frequency control. It will be apparent however that other relations could be established between the signals by appropriate adjustment of the parameters. For example, the aforementioned integral relation can be changed by more than one pulse, say *m* pulses, where *m* is less than *n* as previously defined. Also more than three pulse channels could be employed to provide additional correction signals having other integral relations between the clock rate and the oscillation rate of transistor 11.

Similarly it should be noted that the integral relation (i.e. the value of *n*) between the clock rate and the oscillation period of transistor 11 can be altered by a gross amount by adjustment of potentiometer 25 to change the starting point discharge voltage for capacitor 13 as previously described. For such gross changes in the timing period of transistor 11 the circuit associated with supplying pulses on line 31 can still be used to provide vernier changes in the integral relation by addition and subtraction control to obtain a desired relation as previously described.

The output pulse from the circuit of the present invention may be obtained from the unijunction transistor 11 by connection to base electrode 15 which produces a voltage pulse across impedance 17 due to the current flow which occurs when the emitter 12 reaches the peak point voltage established for the transistor 11. The output pulse on base 15 is applied to a one-shot 45 which produces on output terminal 46 a sharply defined pulse.

For pulse delay operation the circuit may be operated with a flip-flop 47 selectively connected through a switch 48 to control the gate signal applied to terminal 28. The flip-flop 47 is set by an input pulse applied at terminal 49 and is reset by the output pulse on terminal 46 being applied by line 51 to the reset terminal of flip-flop 47. Thus when switch 48 is closed the signals on terminals 27 and 28 require that the flip-flop 47 be set in order to render control transistor 23 non-conductive. An input pulse at terminal 49 sets flip-flop 47 to supply a turn-off gate to gate the control transistor 23 through closed switch 48 into non-conductive condition thereby permitting the charging cycle for capacitor 13 to begin. When the unijuncion transistor 11 conducts, an output pulse appears at terminal 46 which resets the flip-flop 47 thereby making control transistor 23 conduct to assist in the discharge of capacitor 13 and maintain the circuit at the pre-set voltage level established by the emitter of transistor 24 until the next signal pulse occurs at input terminal 49.

Various modes of operation and applications for the circuit of the present invention have been suggested and described in connection with the description of the structure of the circuit. These different modes of operation and the various applications for the circuit will now be apparent to those who are skilled in the art and the invention is to be construed as including these various applications as defined by the scope of the appended claims.

I claim:

1. A pulse generating circuit comprising
a unijunction transistor having base electrodes connected through impedance elements across a supply voltage;
an emitter electrode for said unijunction transistor connected to a timing capacitor;
a charging circuit including a constant current transistor for charging said capacitor to the peak point voltage of said unijunction transistor;
a control transistor connected to control said constant current transistor;
a reference voltage source providing a pre-set voltage level; and
a circuit through the collector-emitter path of said control transistor and the collector-base path of said constant current transistor connecting said capacitor to said reference voltage source for discharging said capacitor to said pre-set voltage level when said control transistor conducts.

2. Apparatus according to claim 1 in which said reference voltage source includes a transistor connected to supply said preset voltage level from the emitter circuit thereof.

3. Apparatus according to claim 1 and including means for controlling the peak point voltage of said unijunction transistor.

4. Apparatus according to claim 3 in which said peak point voltage is controlled by the application of voltage pulses to one of said base electrodes of said unijunction transistor.

5. Apparatus according to claim 4 including means for selectively applying voltage pulses of different amplitude to control said peak point voltage.

6. Apparatus according to claim 5 in which said pulses are derived from a precision clock pulse generator and including means for adjusting the amplitude of said pulses to correspond to $n-m$, $n$ or $n+m$ clock pulses per cycle of oscillation of said unijunction transistor where $n$ and $m$ are integers and $n>m$.

7. Apparatus according to claim 6 and including means for selectively varying said preset voltage level to permit selection of the value of *n*.

8. Apparatus according to claim 1 including gating means for applying a turn-off gate to said control transistor for a predetermined time interval corresponding to a plurality of oscillation periods of said unijunction transistor, and means for selectively varying said preset voltage level over a range lower than the peak point voltage of said unijunction transistor for determining the time position of the first generated pulse relative to the application of said turn-off gate to said control transistor.

9. Apparatus according to claim 1 including a flip-flop for gating said control transistor, input signal means for gating said control transistor off and circuit means coupled to the output of said unijunction transistor for resetting said flip-flop.

10. A pulse generating circuit comprising a unijunction transistor having base electrodes connected through impedance elements across a supply voltage;

an emitter electrode for said unijunction transistor connected to a timing capacitor;

a constant current transistor charging circuit for charging said capacitor to the peak point voltage of said unijunction transistor;

means responsive to an input signal for controlling conduction in said constant current transistor thereby producing periodic pulses when said unijunction transistor conducts to discharge said capacitor;

a plurality of pulse circuits selectively controllable to pass control pulses from a pulse source through a selected one of said pulse circuits;

amplitude selection means for said pulse circuits adjusted to provide a range of control pulse amplitude outputs from said pulse circuits; and means for coupling said outputs from said pulse circuits to alter the peak point voltage of said unijunction transistor in accordance with the amplitude of said control pulse from said selected one of said pulse circuits to make the period of said periodic pulses produced by said unijunction transistor correspond to an integral number of said control pulses.

No references cited.

JOHN S. HEYMAN, *Primary Examiner.*

ARTHUR GAUSS, *Examiner.*

J. ZAZWORSKY, *Assistant Examiner.*